United States Patent

[11] 3,634,205

[72] Inventors Manlio B. Melillo Inglewood; Daniel P. Vlachos, Carmarillo, both of Calif.

[21] Appl. No. 763,373
[22] Filed Sept. 27, 1968
[45] Patented Jan. 11, 1972
[73] Assignee The Bunker-Ramo Corporation Canoga Park, Calif.

[54] METHOD OF PLATING A UNIFORM COPPER LAYER ON AN APERTURED PRINTED CIRCUIT BOARD
3 Claims, No Drawings

[52] U.S. Cl. .......... 204/24, 204/52 R
[51] Int. Cl. .......... C23b 5/48, C23b 5/20
[50] Field of Search .......... 204/52, 44, 24; 106/1; 117/130 E

[56] References Cited

UNITED STATES PATENTS

| | | | |
|---|---|---|---|
| 2,897,409 | 7/1959 | Gitto .......... | 204/24 X |
| 3,119,754 | 1/1964 | Blumenfeld .......... | 204/52 |
| 3,562,117 | 2/1971 | Vander Mey .......... | 204/24 |

OTHER REFERENCES

Frederick A. Lowenheim, Modern Electroplating, pp. 178 & 186, 2nd. Edition, (1963).
Karl S. Willson et al., Plating, pp. 252- 254 and 304, Mar. 1948.
Clifford Struyk et al., Monthly Rev. Am. Electroplaters' Soc. Vol. 33, pp. 923- 934, (1946).
H. E. Haring et al., Transactions Am. Electrochemical Soc., Vol. 44, p. 336, (1923).

*Primary Examiner*—G. L. Kaplan
*Attorney*—Frederick M. Arbuckle

ABSTRACT: A high-speed electrolytic copper plating bath containing an aqueous solution of copper fluoborate and fluoboric acid, and optionally, an alkali metal fluoride and a surface active agent is disclosed. With this bath, a smooth and ductile copper layer can be substantially evenly deposited onto the surfaces of an apertured object such as a printed circuit board.

METHOD OF PLATING A UNIFORM COPPER LAYER ON AN APERTURED PRINTED CIRCUIT BOARD

BACKGROUND OF THE INVENTION

1. Field of the Invention

The present invention relates to a copper plating bath and to a method of coating articles therewith. More particularly, the present invention relates to a high-speed bath for electrodeposition of copper on printed circuit boards.

2. Description of the Prior Art

Irregularly shaped objects, such as apertured printed circuit boards, present special difficulties in the production of uniform coatings on the board and on the walls of the apertures through the board. Typically, the deposited copper will be distributed in a manner in which the thickness of the plated deposit on the board is two to two and one half times the thickness of the deposit in the holes. Furthermore, deposits that are coarse and large grained exhibit poor ductility resulting in cracks and fissures within the plated holes.

Attempts to plate apertured printed circuit boards with electrodeposited copper from a copper sulfate-type plating bath resulted in producing rough, large grained deposits with poor ductility characteristics. Furthermore, this type of bath is considerably less efficient in both its rate of deposition and ability to distribute the copper uniformly between the surface and the hole wall.

OBJECTS AND SUMMARY OF THE INVENTION

It is therefore an object of this invention to provide a new and improved copper plating bath having high-throwing power to deposit copper substantially evenly between a flat surface and apertures therein.

Yet another object of this invention is to provide a method for increasing the reliability, quality and efficiency in the production of electroplated copper articles.

Still another object of the invention is the production of a ductile, smooth and uniformly distributed deposit of copper on apertured printed circuit boards.

These and other objects and many attendant advantages of the invention will become apparent as the description proceeds.

It has been found according to the invention that electrodeposited copper coatings of the desired characteristics are obtained in a plating bath which includes copper fluoborate and acid. These ingredients are preferably present in the bath within selected proportions to achieve optimum operating conditions and deposit properties. A preferred formulation for the plating bath of the invention on a gallon basis comprises:

| | |
|---|---|
| Copper Fluoborate—$Cu(BF_4)_2$ | Equivalent to 3.5 to 6 oz. of copper |
| Fluoboric Acid | 40 to 60 oz. |

The properties of the coating and the operation of the bath are further improved by the addition of a surface active agent and from about 0.4 to 0.6 oz. of potassium fluoride on a gallon basis. Preferably, the surface active agent is a water-soluble, organic wetting agent such as an aliphatic or aromatic sulfonate. A commercial ammonium or sodium secondary alcohol sulfate condensed with varying amounts of ethylene oxide has been found to be very effective in producing coatings according to the invention. The concentration of the surface active agent may range from about 0.5 to 5 ml./gal. of solution although amounts above about 1 milliliter are not usually necessary. Copper fluoborate, fluoboric acid and the surface active agent are liquids and the alkali metal fluoride is readily soluble in water. This is particularly advantageous in both initial measurement and preparation of the commercial bath and subsequent replacement of the chemicals as they become exhausted during use.

The bath of the invention may be utilized to coat solid areas or patterns of conducting metals or alloys thereof such as copper, nickel, iron, tin, and the like. These base coatings may be solid metal articles or insulator articles such as epoxy printed circuit board laminates coated with an initial coating of electroless copper or nickel. The article to be coated is immersed in the bath as a cathode as is a bar of anode which may be a nonconsuming material such as platinum or preferably, a high-purity copper bar. Preferably, this bar is surrounded by a porous bag of inert material, such as Dynel, polypropylene or the like, to collect flake deposits so as to avoid contamination of the bath.

The bath temperature may be varied considerably, satisfactory deposits being obtainable at temperatures from 40° to 130° F. However, it is preferred to operate at ambient temperature conditions of 60° to 80° F. The current density can be varied from 10 to 100 amperes per square foot of cathode area (ASF), it being preferred to operate at 40 ASF when the solution volume to cathode area ratio is in the order of 7.5 to 12:1 and 75 ASF when the solution volume to cathode area ratio is extremely high as in the case of pattern-plated printed circuit boards. At higher current densities, it is preferred to agitate the solution. Agitation may be accomplished by forcing air through the solution, rapidly moving the cathode or by recirculating the solution through the plating tank. Mild air agitation has been found sufficient to provide uniform and effective plating deposits.

DESCRIPTION OF THE PREFERRED EMBODIMENTS

Several printed circuit boards comprising an epoxy laminate having an electroless deposit of copper on each surface thereof were drilled at desired locations with apertures having diameters varying from 0.020 inch to 0.040 inch and wall thicknesses varying from 0.062 in. to 0.032 in. The boards were then solvent cleaned and were immersed in a plating bath having the following composition:

| | |
|---|---|
| Copper Fluoborate | 15 oz./gal. equivalent to 4 oz./gal. copper |
| Potassium Fluoride | 0.5 oz./gal. |
| Tergitol Surfactant | 1 ml./100 gal. |
| Fluoboric Acid | 46 to 50 oz./gal. |

The anode to cathode ratio was maintained from 1:1 to 2:1, and the solution volume to cathode area ratio was about 9:1. Mild air agitation was employed and an oxygen-free high-conductivity copper bar was connected to serve as the anode. The coated boards were connected as cathodes and plated for 50 minutes using 40 amperes per square foot of current to provide deposits of approximately 0.001 inch in thickness.

The boards were removed from the tank, and the thickness of the copper deposit on the surfaces and within the holes was measured. Distribution of copper was found to be excellent, the copper thickness on the board surface to copper thickness in the hole surface varying from about 1.1:1 to 1.2:1. A very uniform, smooth and dense-deposited copper was evident on the board surface and within the holes with no extreme buildups at corners, edges, etc. Sectioned samples were examined at several magnifications, and an excellent thickness and density distribution between the board surface and the hole were observed with no evidence of cracking or striations in any part of the coating. The deposited coating was found to have excellent ductility.

The production of plated printed circuit boards according to the invention has been found to be increased three times over that experienced with the previously utilized copper sulfate baths. The excellent distribution of the copper between the board and the hole has been found to effect a substantial increase in the savings of copper utilized per day. The bath has been found cheaper to maintain and control than those previously utilized and additions of chemicals to this bath are less costly because they are in a purified liquid form. The bath of the invention can be run at a high-current density which permits much higher volume operation than can be achieved with sulfate or other baths.

It is evident that this bath can be utilized to coat conductive articles of many configurations, and in fact, the coated copper articles can in turn be coated with other deposits of conducting metals by electroless or electrolytic means. It is to be realized that only preferred embodiments of the invention have been described and that numerous modificatons, substitutions and alterations are all permissible without departing from the scope of the invention as defined in the following claims.

The embodiments of the invention in which an exclusive property pr privilege is claimed are defined as follows:

1. A method of uniformly electroplating an apertured printed circuit board so as to uniformly coat the conductive coating pattern provided thereon as well as the walls of apertures formed in the insulative substrate thereof, said method comprising the steps of:

placing an anode and said printed circuit board as cathode in contact with an aqueous copper plating bath solution wherein the ingredients are present on a gallon basis in the following proportions:

| | |
|---|---|
| Copper Fluoborate | Equivalent to 3.5 to 6 oz. copper |
| Potassium Fluoride | 0.4 to 0.6 oz. |
| Fluoboric Acid | 40 to 60 oz. |
| Alphatic Sulfonate Surfactant | 0.005 to 0.05 ml.; and |

applying a potential to said anode and cathode to electrodeposit copper to a desired thickness on said conductive coating pattern and on the walls of said apertures.

2. A method according to claim 1 in which said bath is at room temperature and is agitated by bubbling air therethrough.

3. A method according to claim 1 in which the ratio of said anode to said cathode is from about 1:1 to about 2:1 and said current density is from about 10 amps per square foot to about 150 amps per square foot of cathode area and the ratio of solution volume to cathode area is at least about 5:1.

* * * * *